US009653318B2

(12) United States Patent
Or et al.

(10) Patent No.: US 9,653,318 B2
(45) Date of Patent: *May 16, 2017

(54) DIRECTIONAL SIO$_2$ ETCH USING PLASMA PRE-TREATMENT AND HIGH-TEMPERATURE ETCHANT DEPOSITION

(71) Applicant: Applied Materials, Inc., Santa Clara, CA (US)

(72) Inventors: David T. Or, Santa Clara, CA (US); Joshua Collins, Sunnyvale, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/007,175

(22) Filed: Jan. 26, 2016

(65) Prior Publication Data

US 2016/0247689 A1 Aug. 25, 2016

Related U.S. Application Data (63) Continuation of application No. 14/466,808, filed on Aug. 22, 2014, now Pat. No. 9,245,769, which is a (Continued)

(51) Int. Cl.
*H01L 21/02* (2006.01)
*H01L 21/311* (2006.01)
(Continued)

(52) U.S. Cl.
CPC .. *H01L 21/31116* (2013.01); *H01L 21/02057* (2013.01); *H01L 21/324* (2013.01); *H01L 21/326* (2013.01)

(58) Field of Classification Search
None
See application file for complete search history.

(56) References Cited

U.S. PATENT DOCUMENTS 6,057,247 A 5/2000 Imai et al.
6,872,323 B1 3/2005 Entley et al.
(Continued)

FOREIGN PATENT DOCUMENTS

CN 1953156 A 4/2007
CN 101231951 A 7/2008
(Continued)

OTHER PUBLICATIONS

Office Action for U.S. Appl. No. 14/466,808 dated May 14, 2015.
(Continued)

*Primary Examiner* — Michael Lebentritt
(74) *Attorney, Agent, or Firm* — Patterson + Sheridan, LLP (57) ABSTRACT

Methods for processing a substrate are described herein. Methods can include positioning a substrate with an exposed surface comprising a silicon oxide layer in a processing chamber, biasing the substrate, treating the substrate to roughen a portion of the silicon oxide layer, heating the substrate to a first temperature, exposing the exposed surface of the substrate to ammonium fluoride to form one or more volatile products while maintaining the first temperature, and heating the substrate to a second temperature, which is higher than the first temperature, to sublimate the volatile products.

20 Claims, 5 Drawing Sheets

Related U.S. Application Data continuation of application No. PCT/US2013/060195, filed on Sep. 17, 2013.

(60) Provisional application No. 61/874,783, filed on Sep. 6, 2013, provisional application No. 61/709,107, filed on Oct. 2, 2012.

(51) Int. Cl.
 *H01L 21/326* (2006.01)
 *H01L 21/324* (2006.01)

(56) References Cited

U.S. PATENT DOCUMENTS

| | | | | |
|---|---|---|---|---|
| 7,416,989 | B1 * | 8/2008 | Liu | H01L 21/02063 438/706 |
| 7,955,510 | B2 | 6/2011 | Arghavani et al. | |
| 8,980,761 | B2 * | 3/2015 | Or | H01L 21/326 438/706 |
| 9,245,769 | B2 * | 1/2016 | Or | H01L 21/326 |
| 2003/0148621 | A1 | 8/2003 | Takagi | |
| 2007/0123051 | A1 | 5/2007 | Arghavani et al. | |
| 2009/0275205 | A1 | 11/2009 | Kiehlbauch et al. | |
| 2010/0041212 | A1 | 2/2010 | Jinzu et al. | |
| 2014/0094036 | A1 | 4/2014 | Or et al. | |
| 2014/0193979 | A1 | 7/2014 | Or et al. | |
| 2014/0363979 | A1 | 12/2014 | Or et al. | |

FOREIGN PATENT DOCUMENTS

| | | |
|---|---|---|
| CN | 101740338 A | 6/2010 |
| JP | 2002-100574 A | 4/2002 |
| KR | 10-2006-0133606 | 12/2006 |

OTHER PUBLICATIONS

International Search Report and Written Opinion dated Dec. 27, 2013 for PCT/US2013/060195; 12 pages.

Office Action and Search Report for Chinese Application No. 201380061897.2 dated Nov. 17, 2016.

Search Report for Chinese Application No. 201380050387.5 dated Oct. 29, 2016.

* cited by examiner

DIRECTIONAL SIO₂ ETCH USING PLASMA PRE-TREATMENT AND HIGH-TEMPERATURE ETCHANT DEPOSITION

CROSS-REFERENCE TO RELATED APPLICATIONS

This application is a continuation of U.S. patent application Ser. No. 14/466,808, filed Aug. 22, 2014, now U.S. patent No. 9,245,769, which is a continuation of Patent Cooperation Treaty Application Serial Number PCT/US2013/060195, filed Sep. 17, 2013, which claims the benefit of United States Provisional Patent Application Ser. No. 61/709,107, filed Oct. 2, 2012, and of U.S. Provisional Patent Application Ser. No. 61/874,783, filed Sep. 6, 2013. Both are herein incorporated by reference.

BACKGROUND OF THE INVENTION

Field of the Invention

Technology described herein relates to directional etching of native oxides. Specifically, technology described herein relates to pretreatment of an oxide surface to selectively etch the oxide surfaces.

Description of the Related Art

With the increase in transistor density and subsequent decrease in the cross-sectional dimensions of device nodes, which can be less than 22 nm, pre-clean of native oxides is of particular importance. Pre-clean can include pre-contact clean or pre-silicide clean which requires removal of oxides from the bottom of vias or trenches of narrowing cross-sectional dimensions. As critical dimension of semiconductor devices decreases, distances between neighboring features formed on a semiconductor substrate are also shortened. Thus, it is important to control etching between vias and trenches during precleaning to prevent damaging nearby features.

Current precleaning techniques generally includes a conformal etch of the substrate to remove the native oxides, such as $SiO_2$, prior to deposition of silicides or other contacts. However, a standard conformal etch can lead to excessive cross-sectional enlargement of vias and trenches thus creating possible leakage and ultimate device failure. Other precleaning techniques such as sputter etching remove native oxides from trench or contact bottom surfaces. However, the sputtering process can also lead to redeposition of field oxides at the via or trench opening. The redeposited oxides create an overhang at vias and trenches openings leading to poor subsequent contact fill.

Thus, methods are needed to preferentially etch from the bottom surfaces of features to prevent damage to features during precleaning.

SUMMARY OF THE INVENTION

Embodiments described herein generally relate to selective etching of native silicon oxides. In one embodiment, a method can include positioning a substrate in a processing chamber, the substrate comprising an exposed surface, one or more features formed in the exposed surface, the features comprising a bottom surface and an oxide layer formed on the exposed surface; biasing the substrate; exposing the substrate to a low energy inert plasma to selectively form physically or chemically activated material on the exposed surface and bottom surfaces of the features; heating the substrate to a first temperature; exposing the substrate to a processing gas comprising ammonium fluoride ($NH_4F$) or $NH_4F(HF)$ to form one or more volatile products on the exposed surface and bottom surfaces of the features; and heating the substrate to a second temperature, which is higher than the first temperature, to sublimate the one or more volatile products.

In another embodiment, a method can include positioning a silicon-containing substrate in a processing chamber, the silicon-containing substrate including an exposed surface, one or more features formed in the exposed surface and a layer of surface contaminants formed on the exposed surface; cooling the substrate to a first temperature; exposing the exposed surface of the substrate to ammonium fluoride ($NH_4F$), ($NH_4F$)HF or combinations thereof at the first temperature; biasing the substrate; exposing the substrate to a low energy inert plasma to selectively form one or more volatile products on the exposed surface and bottom surfaces of the features; exposing the substrate to low pressure at a second temperature, wherein a non-reacted $NH_4F$ is sublimated from the exposed surface of the substrate; and heating the substrate to a third temperature, which is higher than the first and second temperature, to sublimate the one or more volatile products.

In another embodiment, a method can include positioning a semiconductor substrate in a processing chamber, the semiconductor substrate can include an exposed surface, one or more features formed in the exposed surface and an oxide layer formed on the exposed surface; biasing the substrate; performing a contaminant removal process which can include exposing the substrate to a low energy inert plasma to selectively form physically or chemically activated material on the top and bottom surfaces of the features, heating the substrate to a first temperature, exposing the surface of the substrate to a processing gas comprising ammonium fluoride ($NH_4F$) or $NH_4F(HF)$ to form one or more volatile products on the top and bottom surfaces of the features and heating the substrate to a second temperature, which is higher than the first temperature, to sublimate the one or more volatile products; and repeating the contaminant removal process one or more times.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for removing native oxides are described herein. Precleaning of surfaces in vias and trenches can lead to etching of sidewalls and subsequent reduction of cross sectional dimensions of the solid walls separating the trenches or vias being cleaned from adjacent features in a semiconductor device. This reduction of cross-sectional dimensions can lead to device failure. The embodiments described herein allow for directional etching of surfaces to remove native oxides from bottoms of vias and trenches while preserving the cross-sectional dimensions of the via or trench. By employing a directional pretreatment of the native oxide surface prior to conformal exposure to an etchant at elevated temperatures, the affected surface is prepared for preferential etching while the untreated surface is nominally etched due to equilibrium adsorption/desorption. The invention is more fully explained with reference to the figures below.

Figure 1:
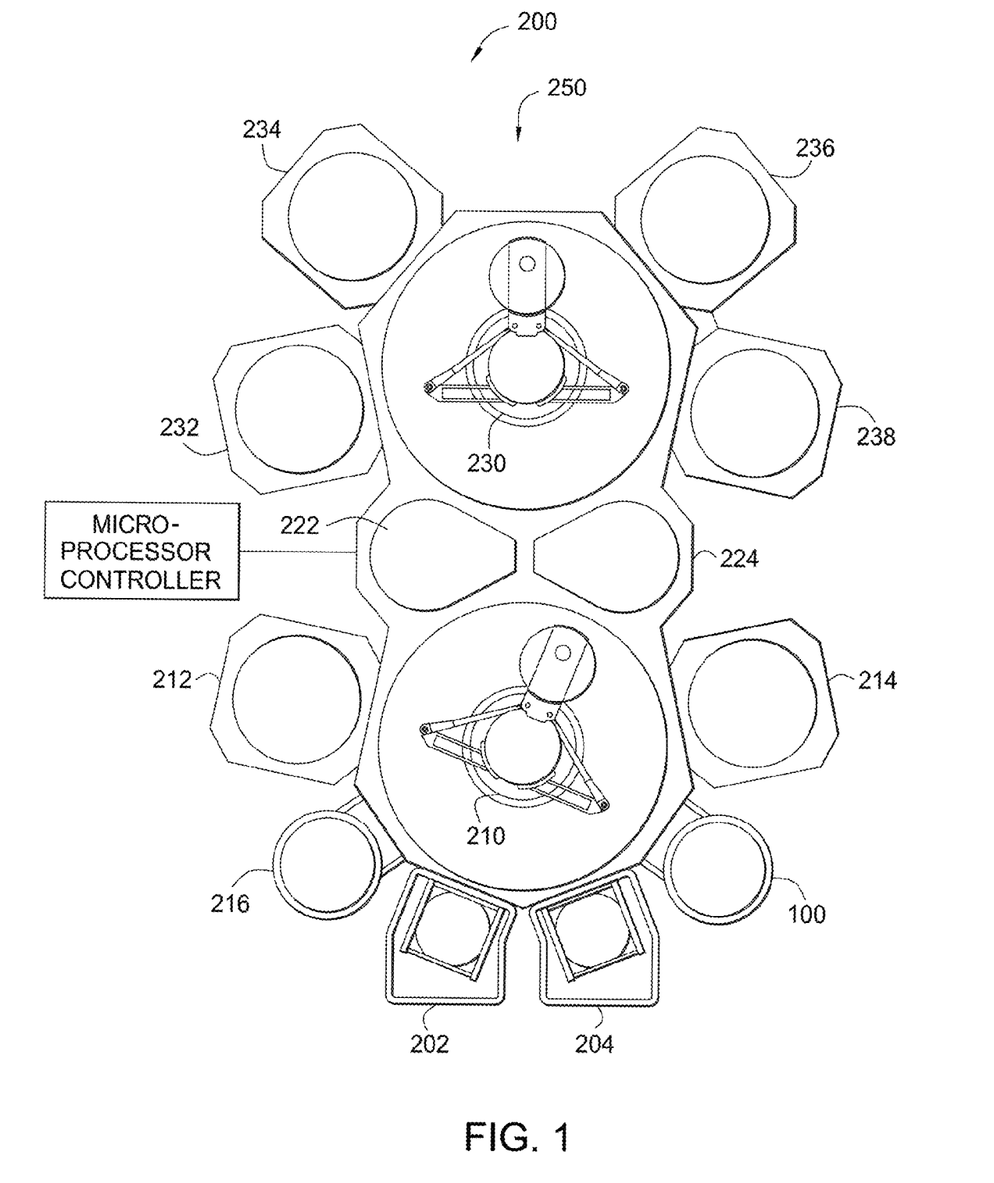
FIG. 1 is a schematic top-view diagram of an illustrative multi-chamber processing system useable with embodiments described herein.

FIG. 1 is a schematic top-view diagram of an illustrative multi-chamber processing system 200 that can be adapted to perform processes as disclosed herein having one or more processing chambers coupled thereto, such as processing chamber 100. The system 200 can include one or more load lock chambers 202, 204 for transferring substrates into and out of the system 200. Typically, since the system 200 is under vacuum, the load lock chambers 202, 204 can "pump down" the substrates introduced into the system 200. A first robot 210 can transfer the substrates between the load lock chambers 202, 204, and a first set of one or more substrate processing chambers 212, 214, 216, 100 (four are shown). Processing chambers 100 and 216 are can be degas chambers to used to pre-heat and drive moisture out of incoming substrates. Processing chambers 212 and 214 can be pre-clean chambers. The positions of the processing chamber 212 and 214 utilized to perform the preclean process relative to the other chambers is for illustration, and the position of the processing chamber 212 and 214 may be optionally be switched with any one of the processing chambers 212, 214, 216 or 100, if desired. Further, one or more of the chambers can be positioned at empty position 250, if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 100, the processing chambers 232, 234, 236, 238 can be outfitted to perform a variety of substrate processing operations.

The processing chamber 212 or 214 may be configured to remove native oxides or other contaminants from a substrate surface prior to forming a pre-contact layer or metal silicide layer on the substrate, such as native oxides from the bottoms of features disposed on a substrate. The processing chamber 212 or 214 can be particularly useful for performing the plasma assisted dry etch process (i.e. the "preclean process"). The processing chamber 212 or 214 may be a Preclean PCII, PCXT or etch chambers which are available from Applied Materials, Inc., located in Santa Clara, Calif.

It is noted that other chambers available from other manufactures may also be utilized to practice the present invention.

After the preclean process is performed in the processing chamber 212 or 214, the substrate may further be transferred to any of the processing chambers 100, 212, 214, 216, 232, 234, 236, 238 disposed in the system 200 to perform the second step of the process, such as a SiConi chamber or etch chamber from Applied Materials, Inc located in Santa Clara, Calif.

Figure 2:
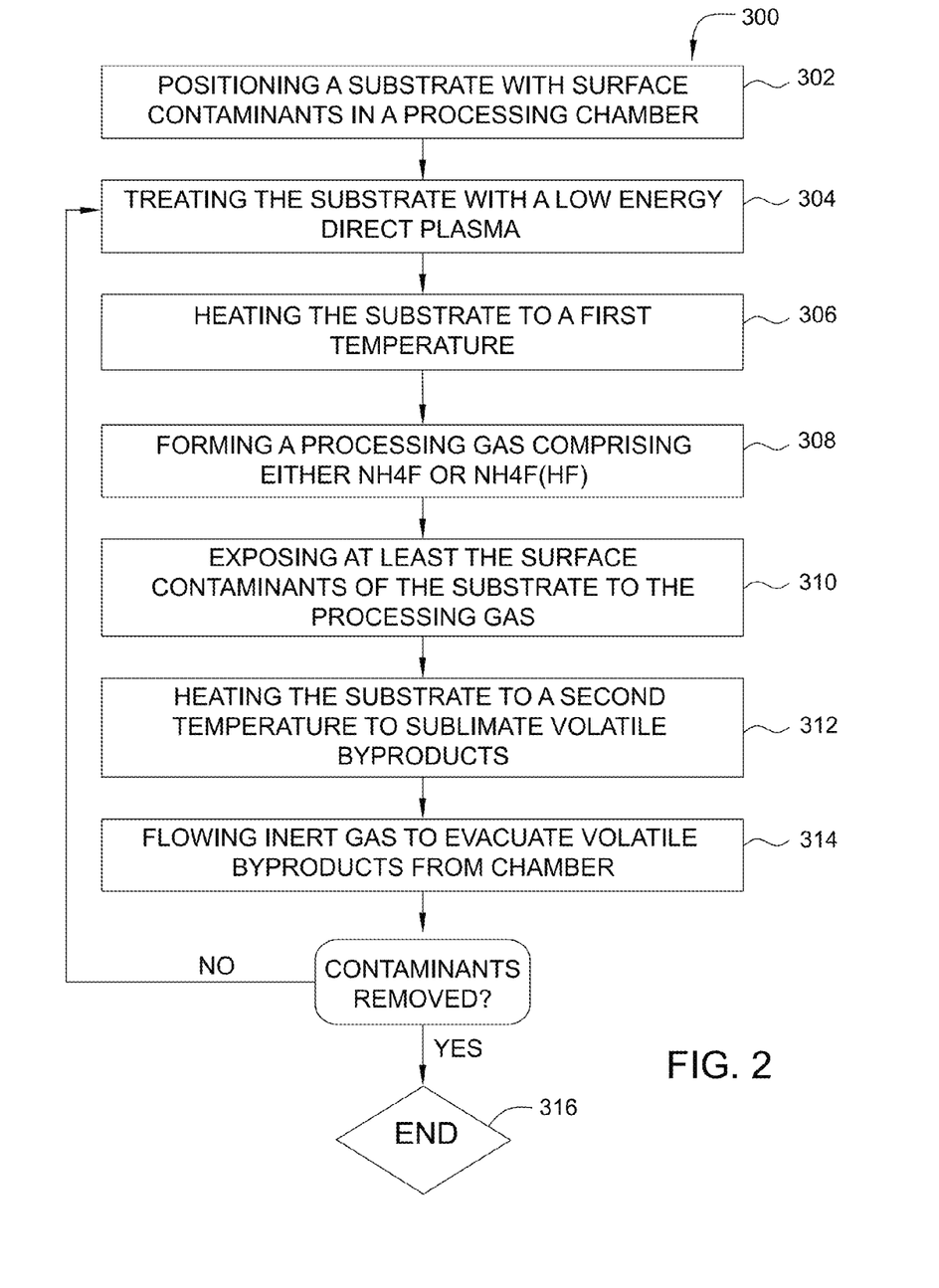
FIG. 2 is a diagram of a method for directional etching according to one embodiment.

FIG. 2 is a diagram of a method for directional etching according to one embodiment. The method 300 can include positioning a substrate with surface contaminants in the processing chamber, as in 302. The processing chamber can be a processing chamber as described with reference to FIG. 1 or it can be a different processing chamber. The processing chamber should be capable of at least maintaining the substrate at a specific temperature, biasing the substrate and forming $NH_4F$ (e.g. creating $NH_4F$ in a plasma). The substrate can be a silicon substrate with features formed on the surface. The features can include one or more of vias and trenches of varying cross-sectional dimensions, such as less than 22 nm. Native oxides may be formed on one or more of the surfaces of the substrate, such as a silicon dioxide formed on all exposed surfaces. The native oxides may also be of varying thickness dependant on the circumstances of formation, such as exposure to the atmosphere.

The method 300 can further include treating the substrate with a low energy direct plasma, as in 304. The direct plasma can comprise any inert gas. Inert gases include noble gases, such as helium or argon. The inert gas is formed into a plasma of sufficiently low energy so as to not sputter the substrate.

The direct plasma includes a bias voltage at the wafer surface which can be due to self-bias, direct application of RF bias energy to the substrate wafer support pedestal, or a combination of both. The bias on the substrate can be of any power, but is preferably below the substrate sputter threshold. The substrate sputter threshold can be less than 150V, such as less than 75V. The bias can be delivered at varying frequencies, such as a bias of 2 Mhz, 13.56 Mhz, 60 Mhz or combinations thereof. The bias applied to the substrate attracts the ionized gas in the plasma toward the substrate, where the ionized gas strikes surfaces which are perpendicular to the direction of ionized gas movement, such as the bottom of a via or trench on a substrate. The ionized gas thus changes the surface by various mechanisms, including mechanical roughening, forming dangling bonds at surface, changing surface density, or formation of amorphous surfaces. These surface changes prepare the surface for subsequent directional etching.

The method 300 can further include heating the substrate to a first temperature, as in 306. The first temperature can be a temperature from 65° C. to 100° C., such as from 70° C. to 100° C., In one or more embodiments, the substrate can be heated to a temperature above 65° C., such as between 65° C. and 110° C., by a heating apparatus formed within the substrate support member. In one embodiment, the substrate is maintained at 70° C. In another embodiment, the substrate is maintained at a temperature of between 70° C. and 110° C.

The method 300 can further include forming ammonium fluoride ($NH_4F$) to etch the substrate, as in 308. $NH_4F$ can be used in dry etch processes for removing silicon oxides, SiN, or other materials from wafer surfaces. $NH_4F$ can be formed in-situ from ammonia ($NH_3$) and nitrogen trifluoride

($NF_3$) gas mixtures within a processing chamber. Etching $SiO_2$ with $NH_4F$ is generally accomplished on a heated substrate. The substrate can be heated to a temperature above the dew point of $NH_4F$. The dew point will be dependent on process conditions such as processing chamber pressure. An etching gas mixture is introduced to the chamber for removing silicon oxides on a surface of the substrate. In one embodiment, ammonia and nitrogen trifluoride gases are then introduced into the plasma chamber to form the etching gas mixture. The amount of each gas introduced into the plasma chamber is variable and may be adjusted to accommodate, for example, the thickness of the oxide layer to be removed, the geometry of the substrate being cleaned, the volume capacity of the plasma, the volume capacity of the chamber, as well as the capabilities of the vacuum system coupled to the chamber. The ratio of the etching gas mixture may be predetermined to remove various oxides on the substrate surface. The ratio of gas mixture in the etching gas mixture may be adjusted to preferentially remove the pre-treated oxides, such as native oxides formed on the top and bottom surfaces of the features. In one embodiment, molar ratio of ammonia to nitrogen trifluoride in the etching gas mixture may be set to uniformly remove silicon oxides.

In one embodiment, etching rate of the etching gas mixture may be adjusted by adjusting a flow rate of nitrogen trifluoride while maintaining a molar ratio of ammonia and nitrogen trifluoride above a predetermined value. In one embodiment, etching rate may be increased or decreased by increasing or decreasing the flow rate of nitrogen trifluoride while the ratio of ammonia and nitrogen trifluoride remains above about 3:1. In another embodiment, the ratio of ammonia and nitrogen trifluoride can be about 1:1.

The ammonia and nitrogen trifluoride gases can be dissociated into reactive species in a remote plasma chamber. The dissociated species can combine to form a highly reactive ammonia fluoride ($NH_4F$) compound and/or ammonium hydrogen fluoride ($NH_4F \cdot HF$) in the gas phase. These molecules react with the substrate surface to be processed. In one embodiment, an inert carrier gas is first introduced into the plasma chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F \cdot HF$, reacts with the silicon oxide surface to form ammonium hexafluorosilicate $(NH_4)_2SiF_6$, $NH_3$, and $H_2O$ products. The $NH_3$, and $H_2O$ are vapors at processing conditions and removed from the chamber by a vacuum pump. A thin film of $(NH_4)_2SiF_6$ is left behind on the substrate surface. This reaction mechanism can be summarized as follows:

$$NF_3 + 3NH_3 \rightarrow NH_4F + NH_4F \cdot + N_2$$

$$6NH_4F + SiO_2 \rightarrow (NH_4)_2SiF_6 + 2H_2O + 4\,NH_3$$

$$(NH_4)_2SiF_6 + heat \rightarrow 2NH_3 + 2HF + SiF_4$$

After the products are reacted, the non-reacted $NH_4F$ can be sublimated at low pressure and removed from the chamber so as to not affect further processing.

The method 300 can further include removing the $(NH_4)_2SiF_6$ by heating the substrate to a second temperature to sublimate volatile byproducts, as in 312. After the thin film is formed on the substrate surface, the support member may be elevated to an anneal position in close proximity to a heated gas distribution plate. The heat radiated from the gas distribution plate may dissociate or sublimate the thin film of $(NH_4)_2SiF_6$ into volatile $SiF_4$, $NH_3$, and HF products. These volatile products are then removed from the chamber by the vacuum pump as described above. Typically, a temperature of 75° C. or more is used to effectively sublimate and remove the thin film from the substrate. Preferably, a temperature of 100° C. or more is used, such as between about 115° C. and about 200° C. Sublimation of solid $(NH_4)_2SiF_6$ can also be accomplished by heating the wafer by increasing the temperature of the wafer susceptor used to support the wafer. The wafer heating can be accomplished in the same process chamber or in another chamber if it is more efficient to move the heat and sublimation step elsewhere.

The method 300 can further include flowing inert gas to evacuate the volatile byproducts from the chamber, as in 314. The thermal energy to dissociate the thin film of $(NH_4)_2SiF_6$ into its volatile components is transferred by the gas distribution plate through convection or radiation. In one aspect, the distribution plate is heated to a temperature of between 100° C. and 150° C., such as about 120° C. Further embodiments use a low energy plasma, such as a plasma as described with reference to the pretreatment process, to enhance the sublimation of volatile byproducts. The plasma is delivered to the surface of the substrate uniformly and at an energy level which will not sputter the oxides form the substrate. By using a low energy plasma while simultaneously heating the substrate, it is believed that the activation energy for sublimation can be reduced. For example, a layer of $(NH_4)_2SiF_6$ may be of a certain thickness which requires a temperature of 120° C. over a certain time period to sublimate. By using a low energy plasma, the layer of $(NH_4)_2SiF_6$ can be sublimated at 100° C. over the same time period or at 120° C. over a shorter time period.

Once the film has been removed from the substrate, the process can be ended, as in 316. The processing chamber is purged and evacuated. The processed substrate is then removed from the chamber by lowering the substrate member to the transfer position, de-chucking the substrate, and transferring the substrate through a slit valve opening.

Without intending to be bound by theory, it is believed that at elevated temperatures and low partial pressures of $NH_4F$ or $NH_4F(HF)$, the chemical etch rate of $SiO_2$ without plasma activation as in 304 can be nominal (e.g. approximately zero) because the partial pressure of $NH_4F$ etchant can be maintained below the partial pressure required for $NH_4F$ condensation (wafer is above dew point temperature for $NH_4F$). During a standard $NH_4F$ etch process, the substrate will be maintained at a temperature less than 40° C., such as a temperature between 25° C. and 40° C. In this temperature range, the reaction between the $NH_4F$ and the oxide layer on the substrate is believed to be reaction limited, such that higher levels of reactant will lead to increased and uniform etching of the oxide layer. When the wafer temperature is raised above the dew point of $NH_4F$, the adsorption rate is closer to the adsorption rate of $NH_4F$ on the substrate surfaces not exposed to plasma activation as in 304, such as trench and via sidewalls. Therefore, the trench and via sidewalls and vertical surfaces in general are not etched. Surfaces on the semiconductor device which have been pretreated with the inert plasma, however, are activated as described in 304 and exhibit enhanced $NH_4F$ or $NH_4F(HF)$ adsorption. On these plasma activated surfaces $NH_4F$ is adsorbed and $NH_4F$ based etching of silicon oxides is achieved. As such, at temperatures from 65° C. to 100° C., such as from 70° C. to 100° C., the silicon oxide is not etched in side walls of vias and trenches, and it is etched in activated areas such as the upper surface of the substrate and bottoms of trenches and vias.

The etching process described by the method above is also capable of selectively etching silicon oxide relative to SiN, Si, and metal silicides. $NH_4F$ etches silicon oxide without substantially etching layers, such as silicon nitride or metal silicides. The selectivity between $SiO_2$ and SiN is greater than 5:1 and in some examples greater than 9:1. Selectivity of $SiO_2$ to Si is at least greater than 5:1. Thus, the above method provides for both selectivity and directionality in etching of silicon oxides. Other oxides such as $GeO_2$ may also be etched in this manner.

It is also possible to etch some metal oxides by the combination of plasma activation and $NH_4F$ or $NH_4F(HF)$ exposure. As an example, Nickel silicide (NiSi) can form mixtures of nickel oxide and silicon oxides on its surface. The plasma activation used in this method can facilitate chemical removal of NiO from the surface by both physical bombardment (sputtering) and by enhanced chemical reaction. Other metal oxides and silicides may be cleaned in similar manner.

The method described above can also be applied to other semiconductor materials, such as SiGe. Air exposed SiGe or Ge rapidly forms a surface layer of adsorbed carbon containing species that generally degrade etching by $NH_4F(HF)$. Plasma activation of the surface has been shown to remove surface carbon and enhance subsequent surface etching by $NH_4F(HF)$. There are many other examples of materials suitable to use with the method described with reference to FIG. 2. These examples are intended to be illustrative of a broader class of cleaning applications and are not intended to be restrictive.

Figure 3:
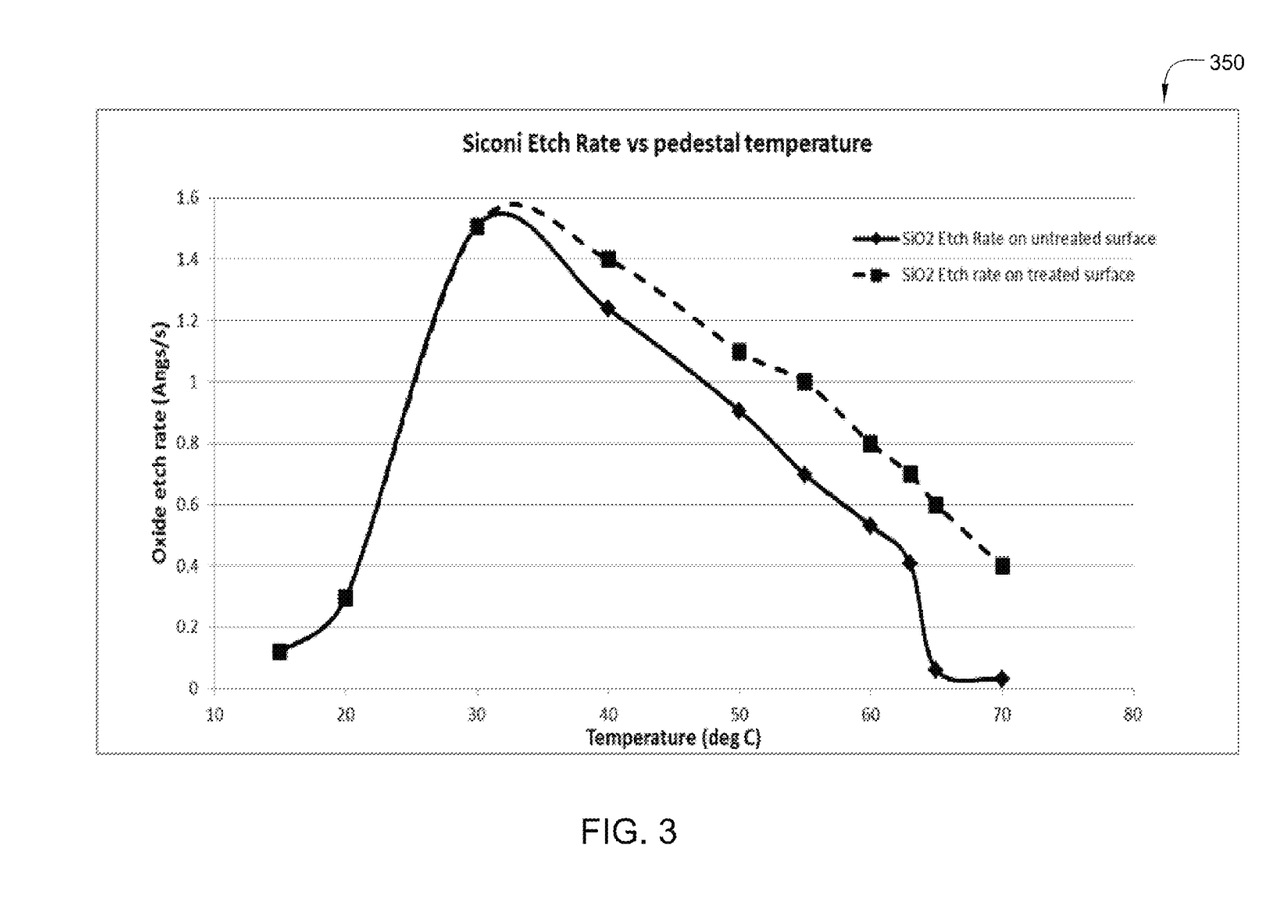
FIG. 3 depicts etch rate of the silicon oxide as a function of pedestal temperature according to one embodiment.

FIG. 3 depicts a graph 350 of the etch rate of the silicon oxide as a function of pedestal temperature, according to one embodiment. A silicon substrate with a silicon oxide layer formed on the surface was positioned in a processing chamber and processed at each temperature level. The substrates were positioned on the substrate support and received a RF bias of 100 W, where the bias is optimally between 25 W and 200 W. A low energy (e.g. argon or helium plasma formed at 100 W RF power) inert plasma was delivered to the biased substrate, pre-treating only the horizontal regions of the substrate. Inert plasma refers to a plasma which is not chemically reactive to $SiO_2$, such as Ar, He, $H_2$, $N_2$ or combinations thereof.

The pre-treated substrate was then exposed to $NH_4F$ etchant remotely generated in the processing chamber at wafer support temperatures between 15° C. and 70° C. Etch rates were measured and plotted as shown in the graph with the oxide etch rate in Å/sec. over temperature in degrees C. Treated and untreated regions showed no difference in temperatures between 15° C. and 30° C. From 30° C. to about 62° C. the treated surface was etched at a higher rate. However, both the treated and untreated surfaces show a linear decline in etch rate. The decline in etch rate after 30° C. is believed to be related to an increase in desorption of the $NH_4F$ from the surface of the substrate prior to the formation of $(NH_4)_2SiF_6$. The etch rate is believed to be higher on the pre-treated surface due to the surface changes from the pre-treatment step. At temperatures higher that 62° C., the etch rate on the untreated surface is substantially lower than either the prior temperature untreated surface etch rate or the treated surface etch rate. It is believed that, at this temperature or above, the adsorption rate and the desorption rate are equal. Thus, a minimal amount of $(NH_4)_2SiF_6$ is formed on the untreated surfaces. The pre-treated surfaces continue to show a linear decline in etch rate but the treated surface etch rates are substantially higher than the untreated surface etch rates. The specific temperature ranges for enhanced $SiO_2$ etch rates shown in FIG. 3 are based on a specific $NH_4F$ partial pressure and associated $NH_4F$ dew point temperature. Processes with higher $NH_4F$ partial pressures can shift their etch rates to higher temperatures than shown in FIG. 3. It is possible to achieve differential etch rates between plasma treated and non-plasma treated surfaces to substrate temperatures of 110° C. or more.

Figure 4A:
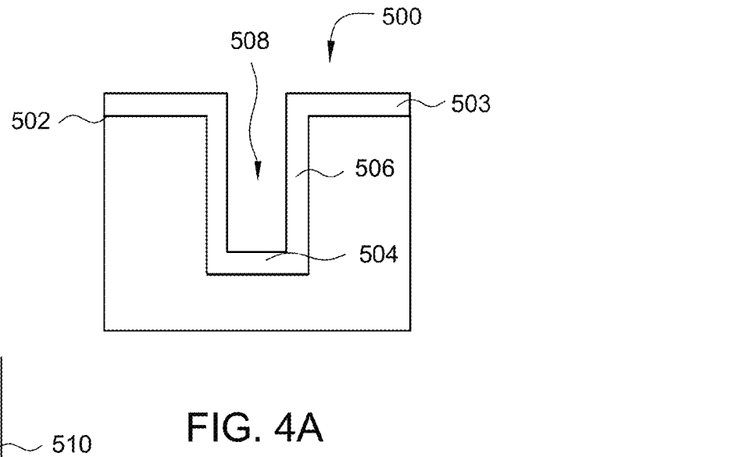
FIGS. 4A-4C are graphical representations of a substrate etched according to one or more embodiments.
Figure 4B:
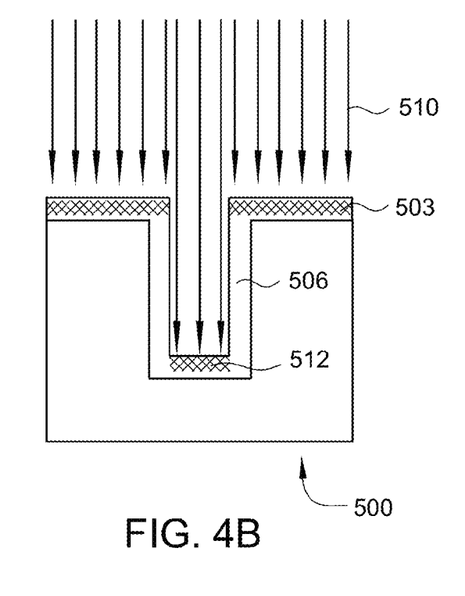
Figure 4C:
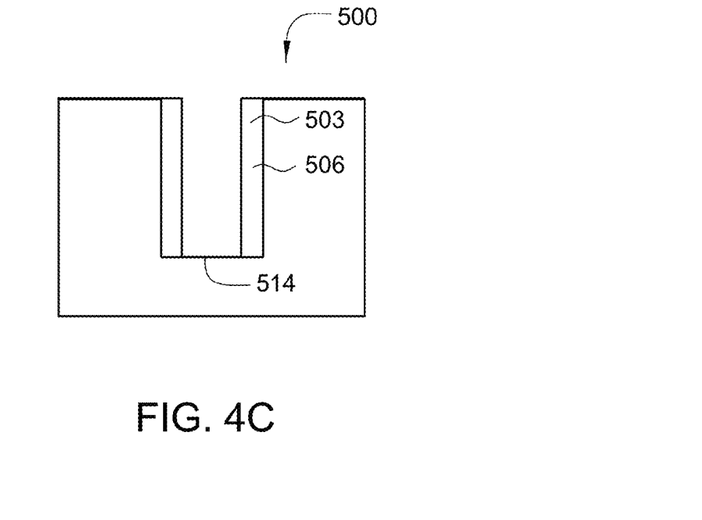

FIGS. 4A-4C are graphical representations of a substrate 500 etched according to one or more embodiments. FIG. 4A depicts a substrate 500 with a surface oxide layer 503 according to one embodiment. The substrate 500 can be a silicon-containing substrate, such as a crystalline silicon substrate. The substrate 500 has an upper surface 502. The upper surface 502 has a surface oxide layer 503 formed thereon, such as a silicon oxide layer formed on a silicon-containing substrate. The surface oxide layer 503 can be a result of transfer between chambers (i.e., exposure to atmosphere). The substrate 500 can further have vias and trenches formed therein, such as a via 508. The surface oxide layer 503 can be sidewall surfaces 506 of features. The substrate 500 can be positioned in a processing chamber as described above.

FIG. 4B depicts a substrate 500 during plasma pre-treatment according to one embodiment. The substrate 500 is treated with a low energy inert plasma 510, as described with reference to the embodiments above. The plasma 510 can alter the top and bottom surfaces 512 without altering the sidewall surfaces 506. The bias in the substrate 500 provides directionality to the low energy inert plasma. The bias delivered to the substrate can be between 20 W and 200 W. Plasma treatment of the surface can also be achieved by relying on self-bias of the wafer in a capacitively coupled plasma or inductively coupled plasma. The biasing plasma may furthermore be run at RF frequencies from 350 KHz to 60 MHz. The biasing plasma may be pulsed or continuous to further tailor the ion dose intensity being delivered to the wafer.

FIG. 4C depicts the substrate 500 after etching with the $NH_4F$ etchant, according to one embodiment. The substrate 500 is heated to a second temperature, such as a temperature higher than 62° C. The substrate 500 is then treated with the previously formed $NH_4F$ etchant. The $NH_4F$ etchant adsorbs preferentially into the horizontal (pre-treated) surfaces 512 with very little adsorbing to the vertical (untreated) surfaces 506. After the $(NH_4)_2SiF_6$ film is formed on and from the horizontal surfaces 512, the substrate is annealed to sublimate the $(NH_4)_2SiF_6$ film thus exposing the cleaned surfaces 514. The thickness and composition of vertical surfaces 506 are substantially unchanged.

It is believed that the high temperature applied to the substrate 500 during the $NH_4F$ plasma treatment further assists in etching by enhancing sublimation. As the temperature that the substrate is maintained at is very close to the temperature which the $(NH_4)_2SiF_6$ film is believed to sublimate, the film is expected to be partially sublimating as it is formed on the pretreated surfaces. Therefore, less annealing is necessary while simultaneously exposing more of the surface to $NH_4F$ etchant.

One alternate implementation captured in this invention is to maintain the wafer above the sublimation temperature for $(NH_4)_2SiF_6$ during the $NH_4F/NH_4F(HF)$ exposure process. In this way chemical etch byproducts are formed and removed simultaneously, which can reduce or eliminate the need for a final substrate anneal step and significantly increase wafer processing throughput.

Figure 5A:
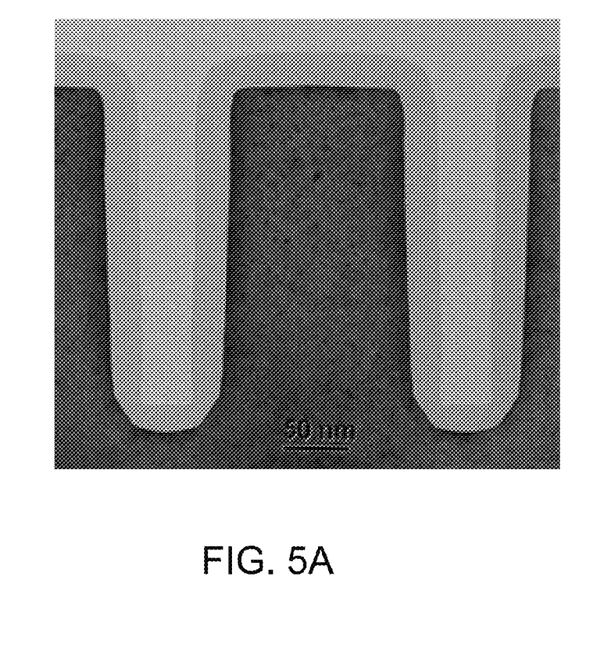
FIGS. 5A and 5B show a transmission electron microscope (TEM) view of a substrate directionally etched as described herein.
Figure 5B:
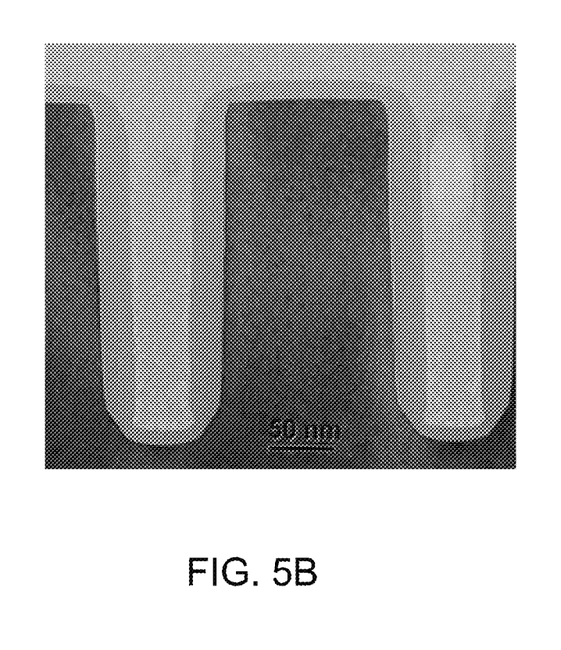

FIGS. 5A and 5B show a transmission electron microscope image of a silicon oxide layer precleaned as disclosed in one embodiment. FIG. 5A shows a silicon substrate with two trenches formed therein. Disposed over the surface of the silicon substrate is a conformal layer of silicon oxide approximately 230 Å thick. FIG. 5B shows an identical structure after directional etching by one embodiment of invention described herein. The silicon substrate was pretreated with a low energy inert plasma at a pressure of 100 mTorr of Argon. Conditions for the plasma were selected to avoid sputtering of the silicon oxide layer. The substrate received a 50 W bias at 13.56 Mhz during the plasma treatment and the plasma was delivered over 10 seconds. Post-inert plasma treatment, the substrate was exposed to $NH_4F$ formed in a remote plasma source. The substrate was maintained at a temperature of 75° C. during the treatment with $NH_4F$. The $(NH_4)_2SiF_6$ film was formed on the pretreated surfaces and sublimated from the surface of the substrate during a post-treatment anneal at 120° C.

FIG. 5B shows substantially reduced oxide thickness at the top and bottom of the trench structures but almost no change in the thickness of the sidewall oxide layers. The bottom etch amount was 91 Å which closely correlates to the slightly higher etch amount of 106 Å on the top surfaces. The side walls were etched from 5 Å at the top side wall to 0 Å at the mid side wall. The determined etch rates show at least a 10:1 preferential etching of the top and bottom surfaces over the sidewall surfaces.

CONCLUSION

Embodiments described herein relate to methods of directional removal of native oxides form a surface. Above embodiments show preferential etching of pretreated surfaces over untreated surfaces. $SiO_2$ is formed by various means on silicon, SiGe, SiC, and various metal silicide surfaces and must be removed for proper deposition in vias and trenches. However, it is important to avoid changing the cross-sectional dimensions of the modern day vias and trenches, which can lead to device failure. By pretreating a biased substrate with a low energy inert plasma, the horizontal surfaces will be modified either physically or by change in the type or bonding energy of available surface sites. Thus, a chemical etch by $NH_4F$ plasma at a high temperature will be effective for removing the pre-treated surfaces without affecting the untreated surfaces on the side walls of the vias or trenches.

While the foregoing is directed to embodiments of the present invention, other and further embodiments of the invention may be devised without departing from the basic scope thereof, and the scope thereof is determined by the claims that follow.

What is claimed is:

1. A method, comprising:
positioning a substrate in a processing chamber, the substrate comprising:
an exposed surface having one or more features formed in the exposed surface, the one or more features comprising a bottom surface; and
an oxide layer formed on the exposed surface;
biasing the substrate;
exposing the substrate to a low energy inert plasma to selectively form physically or chemically activated material on the exposed surface and the bottom surface of the one or more features;
heating the substrate to a first temperature;
exposing the substrate to a processing gas comprising ammonium fluoride ($NH_4F$) or $NH_4F(HF)$ to form one or more volatile products on the exposed surface and the bottom surface of the one or more features; and
heating the substrate to a second temperature, which is higher than the first temperature, to sublimate the one or more volatile products.

2. The method of claim 1, wherein the first temperature and the second temperature are within 10° C. of one another.

3. The method of claim 1, wherein the first temperature is a temperature of at least 65° C.

4. The method of claim 1, wherein the first temperature is a temperature of between 70° C. and 90° C.

5. The method of claim 1, wherein the second temperature is a temperature of greater than 100° C.

6. The method of claim 1, wherein the first and second temperatures are both greater than 100° C., and wherein simultaneous etching and sublimation of etch byproducts occurs.

7. The method of claim 1, wherein the heating the substrate to a second temperature further comprises exposing the exposed surface of the substrate to a low energy inert plasma.

8. The method of claim 1, wherein a plasma is formed from the processing gas and the plasma is formed remotely.

9. The method of claim 8, wherein the plasma comprises ammonium fluoride and is a non-sputtering plasma.

10. The method of claim 1, wherein the processing gas is formed from a gas mixture comprising ammonia ($NH_3$) and nitrogen trifluoride ($NF_3$).

11. The method of claim 10, wherein the gas mixture is a 1:1 or higher ratio of ammonia ($NH_3$) and nitrogen trifluoride ($NF_3$) respectively.

12. The method of claim 11, wherein the ratio of $NH_3$ to $NF_3$ is 5:1 or higher.

13. The method of claim 1, wherein $NH_4F$ is formed in a plasma remote from the processing chamber from a formation gas comprising $NH_3$, $NF_3$, HF, $F_2$, $H_2$, He, Ar or combinations thereof.

14. The method of claim 1, wherein $NH_4F$ is formed in a plasma inside a processing region of the processing chamber from a formation gas comprising $NH_3$, $NF_3$, HF, $F_2$, $H_2$, He, Ar or combinations thereof.

15. The method of claim 1, further comprising:
maintaining the substrate at the first temperature during the exposing the substrate to the processing gas;
moving the substrate to a second chamber; and
sublimating one or more etch byproducts.

16. The method of claim 1, wherein the exposing the substrate to a low energy inert plasma, the heating the substrate to a first temperature, the exposing the substrate to a processing gas comprising $NH_4F$ or $NH_4F(HF)$, and the heating the substrate to a second temperature are repeated one or more times.

17. A method comprising:
positioning a silicon-containing substrate in a processing chamber, the silicon-containing substrate comprising:
an exposed surface;
one or more features formed in the exposed surface; and
a layer of surface contaminants formed on the exposed surface;

cooling the substrate to a first temperature;
exposing the exposed surface of the substrate to ammonium fluoride ($NH_4F$), ($NH_4F$)HF, HF or combinations thereof at the first temperature;
biasing the substrate;
exposing the substrate to a low energy inert plasma to selectively form one or more volatile products on the exposed surface and bottom surfaces of the one or more features;
exposing the substrate to low pressure at a second temperature, wherein non-reacted $NH_4F$ is sublimated from the exposed surface of the substrate; and
heating the substrate to a third temperature, which is higher than the first temperature and the second temperature, to sublimate the one or more volatile products.

18. The method of claim 17, wherein the exposed surface is exposed to a gas mixture comprising ammonia ($NH_3$) and nitrogen trifluoride ($NF_3$), and wherein the gas mixture is a 1:1 or higher ratio of ammonia ($NH_3$) and nitrogen trifluoride ($NF_3$) respectively.

19. The method of claim 17, wherein $NH_4F$ is formed in a plasma remote from the processing chamber from a formation gas comprising $NH_3$, $NF_3$, HF, $F_2$, $H_2$, He, Ar, or combinations thereof.

20. A method, comprising:
positioning a semiconductor substrate in a processing chamber, the semiconductor substrate comprising:
 a top surface having one or more features formed in the top surface; and
 an oxide layer formed on the top surface;
biasing the substrate;
performing a contaminant removal process, comprising:
 exposing the substrate to a low energy inert plasma to selectively form physically or chemically activated material on the top and bottom surfaces of the one or more features;
 heating the substrate to a first temperature;
 exposing the substrate to a processing gas comprising ammonium fluoride ($NH_4F$) or $NH_4F$(HF) to form one or more volatile products on the top and bottom surfaces of the features; and
 heating the substrate to a second temperature, which is higher than the first temperature, to sublimate the one or more volatile products; and
repeating the contaminant removal process one or more times.

* * * * *